United States Patent [19]

Kunkle et al.

[11] 4,060,296

[45] Nov. 29, 1977

[54] LOW PROFILE DIP RECEPTACLE

[75] Inventors: James Raymond Kunkle, Enola; Billy Erik Olsson, New Cumberland, both of Pa.

[73] Assignee: AMP Incorporated, Harrisburg, Pa.

[21] Appl. No.: 735,232

[22] Filed: Oct. 26, 1976

[51] Int. Cl.[2] .......................... H05K 1/12; H01R 5/04; H01R 13/50

[52] U.S. Cl. .............................. 339/17 CF; 339/217 R

[58] Field of Search ................ 339/17 R, 17 C, 17 L, 339/17 CF, 176 M, 176 MP, 217 R, 217 PS, 220 R, 221 R, 221 M, 256 R, 258 R, 258 P

[56] References Cited

U.S. PATENT DOCUMENTS 3,673,551   6/1972   McDonough .................. 339/17 CF

*Primary Examiner*—Roy Lake
*Assistant Examiner*—Neil Abrams

*Attorney, Agent, or Firm*—AMP Incorporated

[57] ABSTRACT

A low profile DIP socket comprising a block-shaped housing with two parallel rows of box-like contact retaining cavities therein and with a rib extending from the inner side wall of each cavity. A DIP lead retaining contact is retained in each cavity and has a generally U-shaped configuration with a first of the two free ended legs having an extension on the free end thereof which is bent back into the channel of said "U" and towards and adjacent to said second leg. A tab is sheared from the bottom of the U-shaped contact and also the first leg thereof to form a slot in said bottom and said first leg thereof and into which said rib fits to orient and stabilize said contact. The tab extends from the closed end of the second leg and through an aperture in the bottom of the cavity in the housing for wire wrapping or other type connection purposes.

15 Claims, 7 Drawing Figures

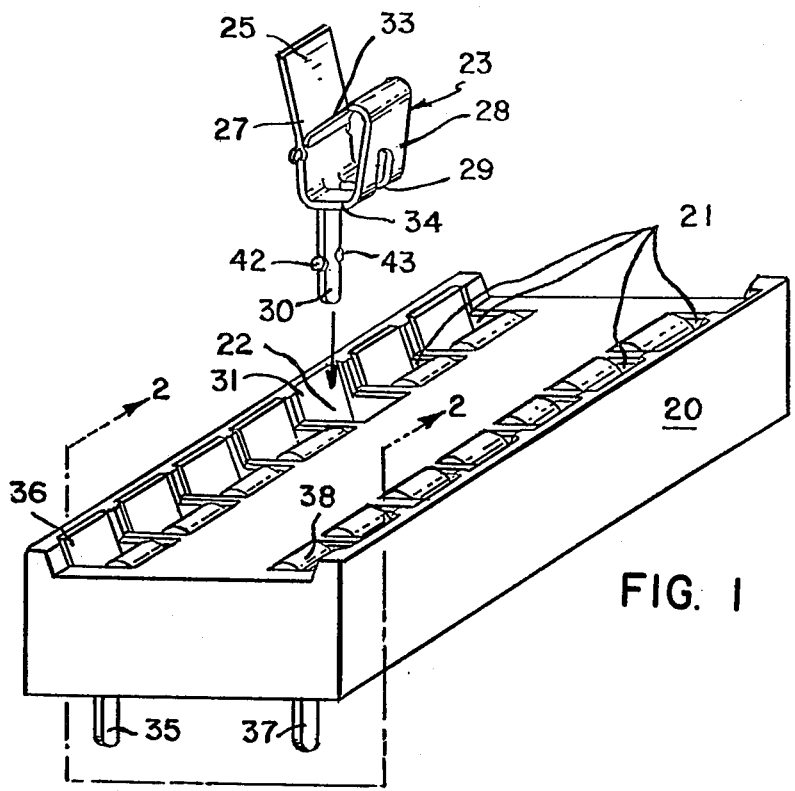
FIG. 1
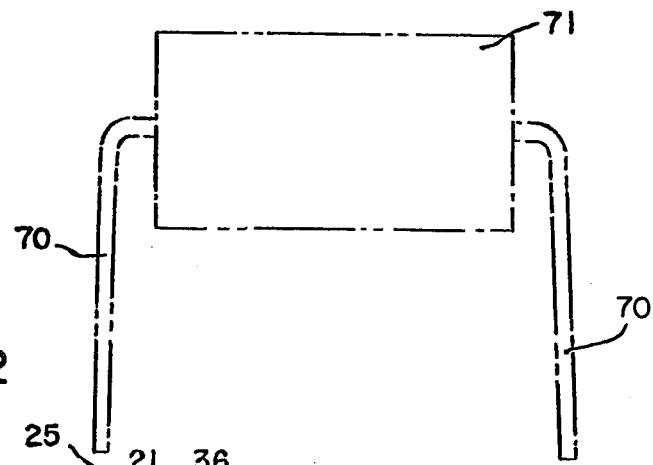
FIG. 2
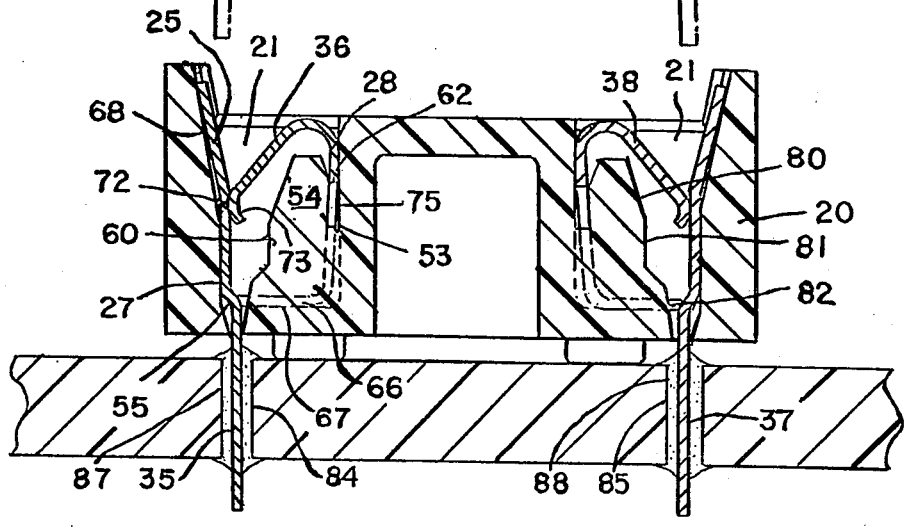

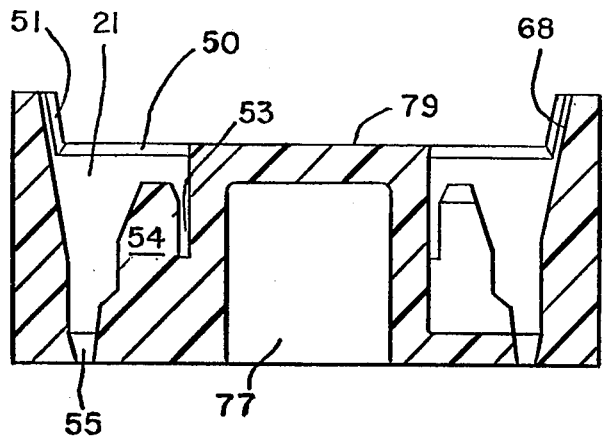
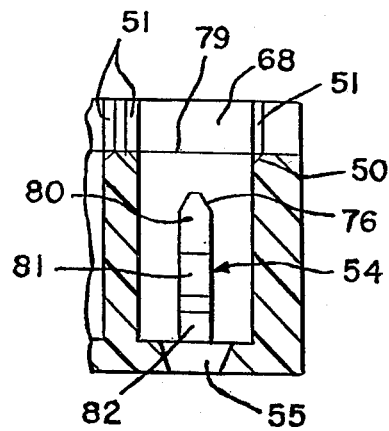
FIG. 4  FIG. 5
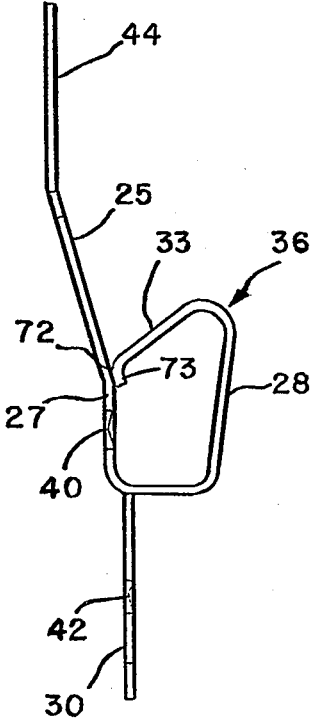
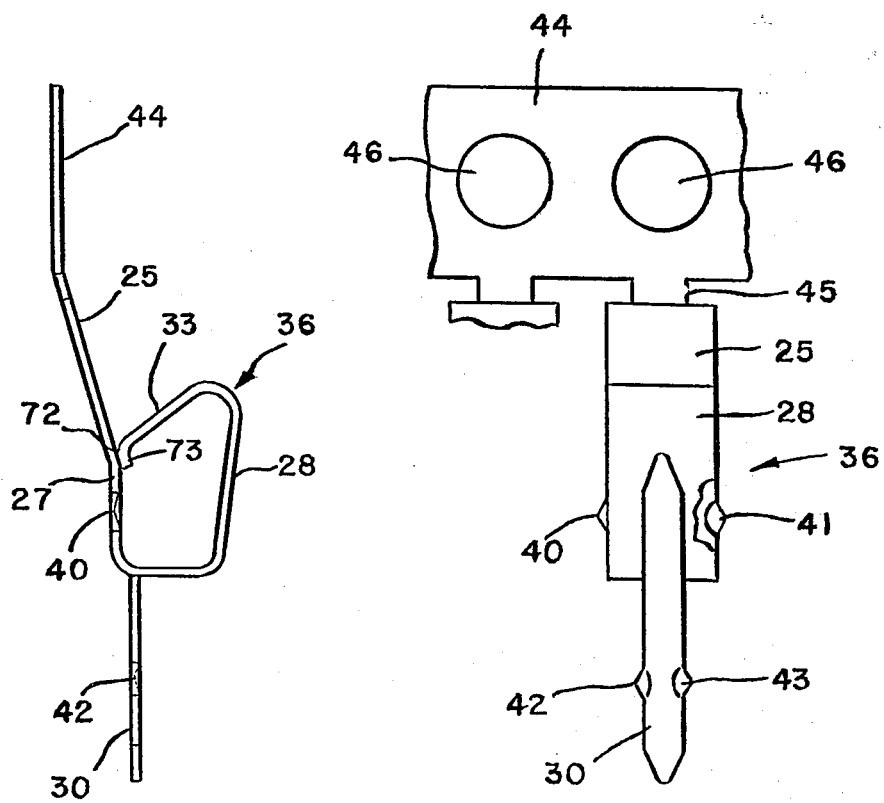
FIG. 7  FIG. 6

LOW PROFILE DIP RECEPTACLE

BACKGROUND OF THE INVENTION

This invention relates generally to dual in-line package (DIP) receptacles and more particularly to low profile DIP receptacles having a pair of rows of contacts therein with each pair of contacts engaging both sides of the DIP leads with metal surfaces.

Dual in-line packages comprise a fairly standardized means of packaging circuit elements which can consist of anything from a plurality of discrete circuit components to a large scale integrated circuit chip. The DIP package consists of a main plastic body having two rows of terminals extending from the side thereof and bent downwardly. These external leads are usually spaced about 0.100 inches apart and with the two rows being spaced approximately 0.300 inches apart. The number of leads or terminals in each row of the DIP terminals can vary greatly, depending upon the contents of a DIP package.

In some applicatons the DIP package is mounted directly on the circuit board either through plated through holes in the board with the leads of the DIP extending through the plated through holes in the board or into miniature type sockets which in turn are fitted into holes in the substrate or printed circuit board. By various soldering techniques the DIP can be then permanently secured to the board. However, such installations present various types of problems including the possibility of damage to one of the fragile DIP leads during insertion into the printed circuit board or the burning or damaging of such DIP leads during the soldering operation. A further disadvantage is that in the event of failure of the circuitry contained within the DIP a difficult problem of replacement is presented. The insertion of the DIP leads directly into the board and retention therein based solely on frictional engagement with the circuit board hole presents some problems because of the fragility of the DIP leads and the force required to frictionally insert them in the holes of a substrate without damaging or breaking the DIP leads.

Various types of sockets are available on the market which are mountable on the surface of a printed circuit board or in apertures or plated through holes formed therein or holes formed therein which contain separately insertable miniature type sockets to receive the DIP leads. The DIP itself is then mounted upon the socket or the female receptacles of the terminals mounted in the plastic housing of the socket.

However, even with the use of a socket certain problems remain unsolved with present day structures. More particularly, such sockets frequently employ housings having apertures therein into which terminals are inserted with the posts extending through one side thereof and then in turn secured within apertures in the circuit board. Such terminals, when inserted into a socket frequently provide the means for solder to leak up through the terminals and wick into the DIP lead terminals and either provide short circuits therein or prevent proper insertion of the DIP lead terminals into the socket. Another problem presented with the many presently available DIP sockets is the fact that the DIP terminals are inserted into apertures in the socket which have metal contacts on one side and plastic on the other. In other words, DIP lead terminals are wedged in-between a metal surface and a plastic surface, thereby reducing the chance for good, permanent, reliable electrical contact between the DIP lead terminals and the desired circuit paths on the printed circuit board.

Even where sockets are employed which overcome most of the foregoing problems there frequently remains the problem of insertion force. More specifically it is necessary that a certain normal force exist between the contacts within the socket and the terminals of the DIP lead in order to maintain proper electrical contact. However, such force is cumulative in that each DIP terminal has such a force exerted thereon and the total insertion force of the DIP into the socket can be very considerable, again often resulting in damage to the DIP leads. Misalignment of the terminals of the DIP, which frequently occur, can also cause damage to the terminals of the socket which by necessity are fragile in order to keep the total insertion force of the DIP below a certain feasible value.

BRIEF STATEMENT OF THE INVENTION

It is a primary object of the present invention to provide a low profile socket mountable on a printed circuit and containing contacts which provide metal to metal contact on both sides of each of the DIP leads.

A second purpose of the invention is to provide a low profile socket for DIPS which is inexpensive to manufacture and which will provide long term reliable connection between the terminals of the DIP and the contacts within the socket.

A third purpose of the invention is a low profile DIP socket in which the contacts within the socket and the socket housing cooperate to provide a fairly constant insertion force for each of the DIP leads and yet allow for misalignment of the DIP terminals without damage to the relatively fragile terminals of the DIP socket. More specifically, the housing cooperates with the structure of the socket contact to provide an anti-overstress function on the socket contact in the event of misalignment of the DIP terminals.

A further object of the invention is a socket consisting of a one piece housing having a plurality of DIP terminal receiving contacts therein with each such contact being formed from a single piece of metal.

A further aim of the invention is a DIP socket having a single housing with a plurality of single piece contacts installed therein and with the housing in the contact being configured in such a manner as to provide accurate guidance of the DIP terminal into the contact, anti-overstress function for the socket contacts, stabilization of the contacts within the socket housing, and positive entry of the DIP leads into the proper entrance area of the socket contact.

In accordance with one form of the invention there is provided a generally U-shaped contact comprised of the two legs of the U and a transverse portion joining said two legs together. One free end of the U-shaped contact is extended and bent inwardly into the interior of the U towards the other leg of said U-shaped contact. Further, a solder tab has been sheared out of the interior of the U-shaped contact, including the transverse portion of the U and that leg of the U having the extended end. Said solder tab is extended downwardly from the said second leg of the U and ultimately is inserted through an aperture provided therefor in the printed circuit board. The socket housing is a relatively flat rectangularly-shaped element having a series of cavities extending down either side of one of the two major surfaces thereof. One of the contacts fits into each of said cavities.

Each cavity is separated from the adjoining cavity by a partition and has a rib-like element extending into the cavity from the center line of the housing. Such rib-like portion is constructed and designed to fit within the slot in the first leg on the transverse portion of the U-shaped contact left therein when the solder tab is sheared therefrom. The cooperation between the rib-like portion of each cavity and the slot formed in the contact function to stabilize the contact and also to provide an anti-overstressing means for the bent over portion of the first leg of the U-shaped contact when a DIP lead is inserted therein between the second leg of the contact of the bent over portion of said first leg.

An aperture is formed in the bottom of each cavity through which the solder tab passes and extends out the lower major surface of the socket housing for insertion through an aperture provided therefor in the printed circuit board. The aperture is formed to fit snugly around the solder tab to prevent wicking of solder up through the junction of said solder tab and said aperture.

Each cavity in the socket is further formed with an outwardly flanged surface against which the second leg of the U-shaped terminal rests. Said second leg is also being flared outwardly to provide the flared entrance for guiding the terminal of the DIP therein and allowing for a degree of misalignment of said DIP terminal. A notch is provided between the rib and the inner wall thereof to provide a retaining means or holding means for the closed end of the slotted second leg to retain said second leg securely against said inner wall of the cavity.

BRIEF DESCRIPTION OF THE DRAWINGS

The above-mentioned and other objects and features of the invention will be more fully understood from the following detailed description thereof when read in conjunction with the drawings in which:

FIG. 1 is a perspective view of the completed socket but with one contact being positioned above the cavity into which it is to be inserted;

FIG. 2 is a sectional view of FIG. 1 taken along the plane 2—2 and showing the relationship of the profile of the cavity and the profile of the contacts as well as the relationship of said contacts to a DIP which is to be inserted therein and shown poised above the socket;

FIG. 4 is a sectional view of a cross-section of the cavity taken along the plane 2—2 of FIG. 1 but without the contacts being inserted therein;

FIG. 5 is a sectional view of a cavity taken along the plane 5—5 of FIG. 3 and illustrating the positioning of the ribs within the cavities;

FIG. 6 is a front view of a contact shown while still attached to a carrier strip; and FIG. 7 is a side view of the contact of FIG. 6.

DETAILED DESCRIPTION OF THE INVENTION

Figure 3:
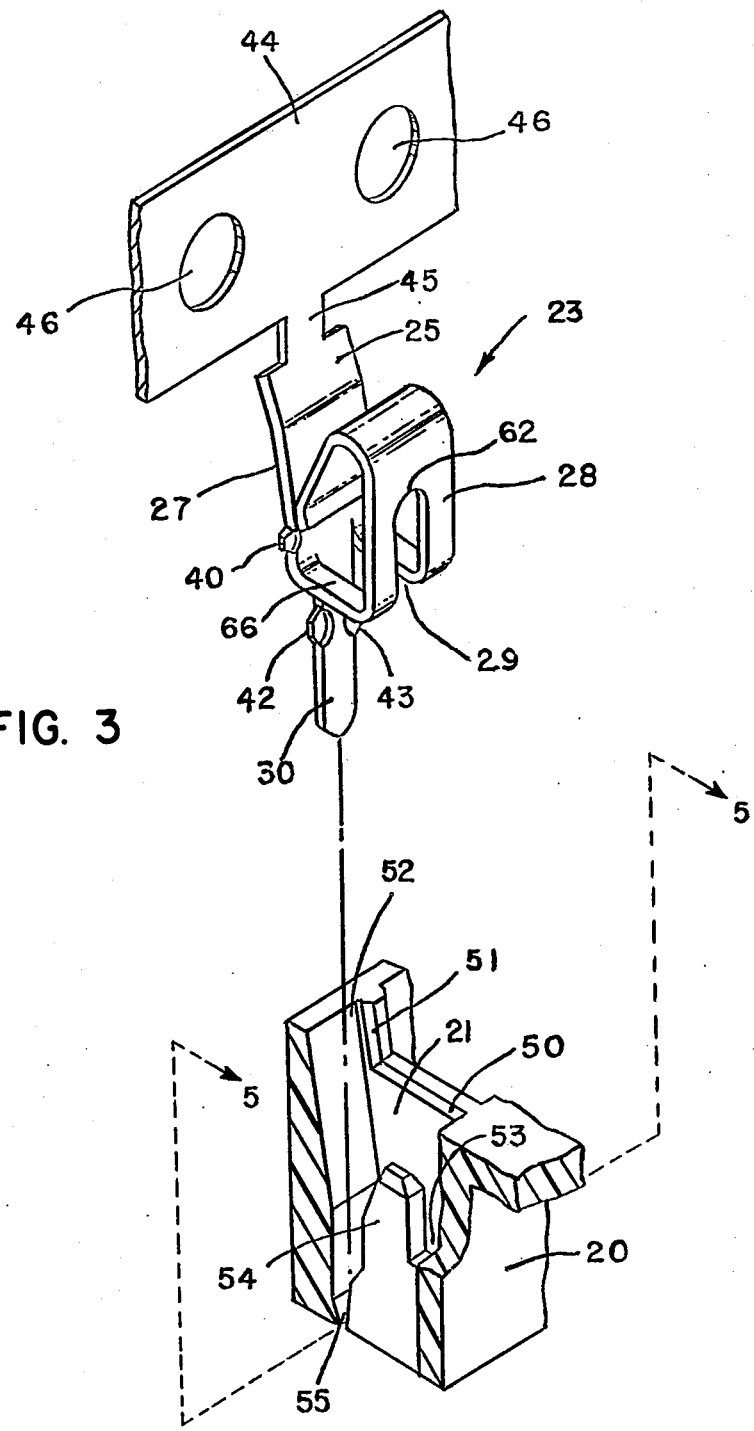
FIG. 3 is a enlarged view of a single cavity of the socket housing with the contact to be inserted therein poised above.

Referring now to FIG. 1 there is shown a perspective view of the overall socket with all of the contacts inserted therein except for one contact 23 which is shown poised above a cavity 22 into which the contact 23 is to be inserted.

In FIG. 1 it can be seen that there are two rows of seven cavities with the cavities being identified generally by reference character 21 and with one cavity by reference character 22. The interior configuration of the cavity is adapted to receive, stabilize, orient and retain the contact 23. The said contact 23 can be seen to be generally U-shaped in configuration with two main legs 27 and 28 joined together by a transverse portion 34. A first leg 28 of the two legs has an extended portion 33 which is bent downwardly and into the channel of the contact towards the other leg 27. The terminal of the DIP is received between the junction of the leg 27 and the bent over portion 33 of the other leg 28, as will be discussed in detail later.

A tail, or tab 30, is sheared from the bottom of transverse portion 34 of the contact and a part of the center portion of the first leg 28, leaving the slot 29 extending across the transverse portion 34 and up into the first leg 28.

The cavity 22 has a rib portion formed therein, to be discussed in more detail in connection with FIGS. 2 and 3, which fits into the slot 29 and performs various functions such as stabilization and orientation of the contact 23. Further, such rib provides an anti-overstress function for the bent over portion 33 of the contact.

Referring now to FIG. 2 the two contacts 36 and 38 are shown in their cavities 21. However, since the two contacts 36 and 38 are identical, except that they are mirror images of each other, only the contact 36 and the cavity 21 in which it is inserted will be discussed.

The contact 36 is inserted in cavity 21 with the transverse or bottom portion 66 of the contact resting on the bottom surface 67 of cavity 21, and with the tab 35 extending through an aperture 55 provided in the bottom of cavity 21. The aperture 55 is designed with angled sides which converge towards each other at the bottom thereof as shown in FIG. 2 (although convergence could be at another point) to provide a slip fit with a very small clearance between the bottom of the aperture 55 and the solder tab 35 inserted therein to thereby prevent solder wicking. If the solder tab 35 is strong enough the bottom of aperture 55 can be slightly smaller than aperture 55 to provide a substantially sealed connection with solder tab 35. The solder tabs 35 and 37 are shown inserted through apertures 84 and 85 in printed circuit board 86, and soldered therein with solder connections 87 and 88 which can extend completely through the apertures 84 and 85 to both sides of board 86.

The tapered back portion 25 of the first leg 27 of contact 36 lies back against the tapered inner surface 68 of cavity 21 to provide a flared opening to assist in guiding the terminal 70 of DIP 71 into contact 36.

The other or second leg 28 of the contact fits up against the inner wall 75 of the cavity, which inner wall 75, along with the configuration of the rib 54, provides a slot 53 into which a portion of the leg 28 is lodged to hold the leg 28 securely in position in the cavity and primarily against the inner wall 75 of the cavity.

As discussed briefly above, the contact 36 has a slot 29 (see FIG. 3) formed therein by virtue of the formation of the tab 35 which results in said slot 29. The slot 29 is slightly greater in width than the rib 54 shown in FIG. 2 and is positioned so that the rib 54 passes through said slot 29 and functions to stabilize and orient the contact 36. The rib 54 further has a configuration such that the excursion of the curved-in end portion 73 of the bent back extension 33 of the contact 36 will be limited by the portion 60 of the rib as the lead 70 of the DIP is inserted therein in the event that some misalignment of the lead 70 is present.

It is evident that the lead 70 enters in-between the nose portion 72 of the extension 33 of leg 28 and the inner surface of the leg 27 of contact 36, thus providing a metal contact on both sides of the DIP leg 70.

In FIG. 3 it can be seen that the contact 23 has retention nodules or burrs, such as burrs 40 and 42 which perform the following functions. The burr 40 functions to scrape against the side of the cavity 21 to retain the contact 23 securely therein. The burr 42 functions to prevent the socket from being easily lifted out of its position on the printed circuit board during wave soldering since burr 42 passes below the bottom wall of the cavity 21, and into the printed circuit board aperture, thereby providing a friction fit with the walls of said circuit board aperture.

In FIG. 6 there are shown two cavity retaining burrs 40 and 41 positioned on either side of the contact. Similarly, there are two burrs 42 and 43 positioned on either side of the solder or wire wrap post 30 to assist in retaining the socket upon the printed circuit board prior to wave soldering. The remaining elements of the contacts shown in FIGS. 6 and 7 are identified by reference characters which identify corresponding elements thereof as shown in FIGS. 2 and 3.

It is to be noted that the contacts 36 can be formed on a carrier 44 which is joined to the individual contacts, such as contact 36, by small neck areas 45. The holes 46 in carrier 44 perform the usual function of facilitating manufacture of the contacts and subsequently enabling automatic insertion of the contacts into the cavities of the DIP socket.

In FIG. 4 there is shown a sectional view of the cavity taken transversely across the length of the socket housing and along the plane 2—2 of FIG. 1 but without the contacts therein. In FIG. 4 the beveled edges 50 and 51 can be seen which facilitate the entry of the contact into the cavity 21. Also the slot 53 behind the rib 54 is clearly illustrated as well as is the aperture 55 in the bottom of the cavity 21, and through which the tab 30 of the contact extends and ultimately is inserted in appropriate female receptacles such as an aperture in a printed circuit board. The area 77 simply represents a cavity formed in the bottom of the socket in order to conserve plastic. There can be a series of such apertures 77 with ribs therebetween for structural strength purposes.

In FIG. 5 there is shown an end view of one of the cavities taken along the length of the socket housing. In FIG. 5 the rib 54 is shown with its three surfaces 80, 81 and 82 which are also shown in the right hand cavity of FIG. 2.

The top of the rib 54 has beveled surfaces 76 on both sides thereof to facilitate entry of the contact thereon. The slot 55 is the slot into which the tab 35 of the contact is inserted therethrough. At the top of the cavity of FIG. 5 is shown the beveled surfaces 51 and 50, also shown in FIG. 4. The slanted surface 68 of FIG. 5 is also shown in FIGS. 4 and 2. The solid line 79 represents the top surface of the socket as indicated in FIG. 4.

It is to be understood that the form of the invention shown and described herein is but a preferred embodiment thereof and that various changes can be made in the design thereof without departing from the spirit and scope of the invention.

We claim:

1. A low profile DIP socket comprising:
   a block-shaped housing being generally rectangularly shaped and having parallel major surfaces with two parallel rows of contact retaining cavities formed therein along one of said major surfaces;
   each of said cavities being generally box-like in shape and having side walls and a bottom with an aperture therein and comprising a rib-like element extending from a first side wall of said cavity nearest the center line of said first major surface;
   a single element contact retained in each cavity and comprising:
      a generally U-shaped configuration having first and second legs with a transverse element joining together said legs;
      a first of said legs having a free ended extension thereon which is bent back into the channel of said "U" and back towards and adjacent to said second leg; and
      a tab sheared from the center portion of said transverse element and said first leg and extending downwardly from said second leg through said aperture in said bottom of said cavity and leaving a slot in the center portion of said transverse element and said first leg;
   each of said contacts being positioned in one of said cavities with said transverse element positioned near the said bottom of said cavity and the rib of said cavity extending through the slot in said contact.

2. A low profile DIP socket as in claim 1 in which said housing comprises a pair or ridges formed on said one major surface alongside and adjacent each of said rows of cavities with a given surface on each of said ridges forming a continuation of that wall of each cavity against which said second leg of the retained contact is positioned and which is flared outwardly and away from said cavity;
   said contact means being formed with said second leg being flared outwardly from the "U" thereof to follow the outwardly flared given surface of said ridge to provide a flared opening to guide a terminal of said DIP therein.

3. A low profile DIP socket as in claim 1 in which the free end of said extension is bent back towards said first leg to provide a convex surface against which an inserted DIP leg will bear.

4. A low profile DIP as in claim 1 in which said rib-like element is separated from said first side wall a distance sufficient to allow the first leg at the closed end of said slot to be retained between said rib-like means and said first side wall.

5. A low profile DIP socket comprising:
   housing means having two parallel major surfaces with two parallel rows of contact retaining cavities formed in one of said major surfaces;
   each of said cavities having side walls and a bottom with an aperture therethrough and further comprising a rib-like element extending into said cavity from one of said side walls;
   a contact means retained in each cavity and comprising:
      a generally U-shaped configuration having first and second legs with a transverse element joining together said legs;
      a first of said legs having an extension thereon which is bent back downwardly into the channel of said "U" and towards and adjacent said second leg; and a tab sheared from the center portion of said transverse element and said first leg and extending downwardly from said second leg through said aperture in said bottom of said cavity and leaving a slot in the center portion of said transverse element and said first leg;

each of said contact means being positioned in one of said cavities with said transverse element resting on the said bottom of said cavity and the rib of said cavity extending through the slot in said contact means.

6. A low profile DIP socket as in claim 5 in which said housing comprises a pair of ridges formed on said one major surface alongside and adjacent each of said rows of cavities with a given surface on each of said ridges forming a continuation of that wall of each cavity against which said second leg of the retained contact is positioned and which is flared outwardly and away from said cavity;

said contact means being formed with said second leg being flared outwardly from the "U" thereof to follow the outwardly flared given surface of said ridges to provide a flared opening to guide a terminal of said DIP therein.

7. A low profile DIP socket as in claim 5 in which the free end of said extension is bent back towards said first leg to provide a convex surface against which an inserted DIP leg will bear.

8. A low profile DIP as in claim 6 in which said rib-like element is separated from said first one side wall a distance sufficient to allow the said first leg at the closed end of said slot to be retained between said rib-like means and said first side wall.

9. A low profile DIP socket comprising:

a block-shaped housing with at least one row of contact retaining cavities formed therein along one of the surfaces thereof;

each of said cavities being generally box-like in shape and having side walls and a bottom with an aperture therethrough and further comprising a rib-like element extending into said cavity from the side wall of said cavity nearest the center line of said one surface;

a contact means retained in each cavity and comprising:

a generally U-shaped configuration having first and second legs with a transverse element joining together said legs;

a first of said legs having a free ended extension thereof which is bent back downwardly into the channel of said "U" and towards and adjacent said second leg; and a tab sheared from near the center portion of said transverse element and said first leg and extending downwardly from said second leg through said aperture in said bottom of said cavity and leaving a slot in the center portion of said transverse element and said first leg;

each of said contact means being positoned in one of said cavities with said transverse element positioned near said bottom of said cavity and the rib of said cavitiy extending through the slot in said contact means.

10. A low profile DIP socket as in claim 9 in which said housing comprises a ridge formed on said one major surface alongside and adjacent said row of cavities with a given suface on said ridge forming a continuation of that wall of each cavity against which said second leg of the retained contact is positioned and which is flared outwardly and away from said cavity;

said contact means being formed with said second leg being flared outwardly from the "U" thereof to follow the outwardly flared given surface of said ridge to provide a flared opening to guide a terminal of said DIP therein.

11. A low profile DIP socket as in claim 9 in which the free end of said extension is bent back towards said first leg to provide a convex surface against which an inserted DIP leg will bear.

12. A low profile DIP as in claim 9 in which said rib-like element is separated from said one given side wall a distance sufficient to allow the said first leg at the closed end of said slot to be retained between said rib-like means and said side wall.

13. A low profile DIP as in claim 9 in which each of said apertures in the bottom of said housing is constructed to have at least one portion thereof slightly larger than the solder tab extending therethrough to provide a slip fit therethrough for said solder tab to inhibit the flow of solder up through said aperture around said solder tab and into said contact retaining cavity when solder is applied to said solder tabs.

14. A low profile DIP as in claim 9 in which each of said apertures in the bottom of said housing is constructed to have at least one portion thereof slightly smaller than the solder tab extending therethrough to provide a press fit therethrough for said solder tab to inhibit the flow of solder up through said aperture around said solder tab and into said contact retaining cavity when solder is applied to said solder tabs.

15. A low profile DIP socket comprising:

housing means having at least one major surface with at least one contact retaining cavity formed in said major surface;

said cavity having side walls and a bottom with an aperture through said bottom and further comprising a rib-like element extending into said cavity from a first of said side walls;

contact means retained in said at least one cavity and comprising:

a generally U-shaped configuration having first and second legs with a transverse element joining together said legs;

a first of said legs having a extension thereon which is bent back downwardly into the channel of said "U" and towards and adjacent said second leg; and a tab sheared from the center portion of said transverse element and said first leg and extending downwardly from said second leg through said aperture in said bottom of said at least one cavity and leaving a slot in the center portion of said transverse element and said leg;

said contact means being frictionally retained in said at least one cavity with said transverse element positioned near said bottom of said cavity and the rib of said cavity extending through the slot in said contact means.

* * * * *